US009659122B2

(12) United States Patent
Graning et al.

(10) Patent No.: US 9,659,122 B2
(45) Date of Patent: May 23, 2017

(54) AERODYNAMIC DESIGN OPTIMIZATION USING INFORMATION EXTRACTED FROM ANALYSIS OF UNSTRUCTURED SURFACE MESHES

(75) Inventors: Lars Graning, Weimar (DE); Markus Olhofer, Seligenstadt (DE); Bernhard Sendhoff, Bruchkobel (DE)

(73) Assignee: Honda Research Institute Europe GmbH, Offenbach/Main (DE)

( * ) Notice: Subject to any disclaimer, the term of this patent is extended or adjusted under 35 U.S.C. 154(b) by 1454 days.

(21) Appl. No.: 12/166,568

(22) Filed: Jul. 2, 2008

(65) Prior Publication Data
US 2009/0012752 A1 Jan. 8, 2009

(30) Foreign Application Priority Data
Jul. 5, 2007 (EP) .................................... 07111858

(51) Int. Cl.
G06F 17/50 (2006.01)
F01D 5/14 (2006.01)
G06F 17/10 (2006.01)

(52) U.S. Cl.
CPC ........... G06F 17/504 (2013.01); F01D 5/141 (2013.01)

(58) Field of Classification Search
CPC ... G06F 17/50; G06F 17/5086; G06F 17/5004
See application file for complete search history.

(56) References Cited

U.S. PATENT DOCUMENTS 5,515,477 A * 5/1996 Sutherland ..................... 706/41
7,370,019 B2 5/2008 Mattiussi et al.
2005/0159936 A1* 7/2005 Rees et al. ....................... 703/6

FOREIGN PATENT DOCUMENTS

EP          1486893 A     12/2004
WO    WO 03/021498 A2    3/2003

OTHER PUBLICATIONS

Ahuja et al. "Design Optimization of Complex Flowfileds Using Evolutionary Algorithms and Hybrid Unstructured CFD", 2005, AIAA, 12 pages.*
Natarajan, A. "Aeroestasticity of Morphing Wings Using Neural Networks", 2002, Dissertation, 182 pages.*
Maggiore et al. "Estimator design in jet engine applications", 2003, Engineering Applications of Artificial Intelligence 16, pp. 579-593.*

(Continued)

*Primary Examiner* — Suzanne Lo
(74) *Attorney, Agent, or Firm* — Fenwick & West LLP

(57) ABSTRACT

A computer-implemented method of analyzing data representing the optimization of real-world designs of physical entities according to at least one criterion. Different modifications of the design are generated by a cyclic optimization algorithm. The design data is represented by unstructured triangular surface meshes. A displacement measure representing local differences between two design modifications of the different modifications is calculated. Performance difference between the two design modifications is calculated. The performance difference is represented by at least one criterion. Sensitivity information representing correlation between the displacement measure and the performance differences is outputted.

13 Claims, 12 Drawing Sheets

(56) References Cited

OTHER PUBLICATIONS

Kim et al. "Eulerian shape design sensitivity analysis and optimization with a fixed grid", 2005, Comput. Methods Appl. Mech. Engrg. 194, pp. 3291-3314.*

Alexa, M., "Recent Advances in Mesh Morphing," Computer Graphics Forum, 2002, pp. 173-197, vol. 21, No. 2.

Bohnenberger, O. et al., "Automatic Design of Truss Structures using Evolutionary Algorithms," IEEE Conference on Evolutionary Computation, 1995, pp. 143-147.

Bowers, C.P., "Formation of Modules in a Computational Model of Embryogeny," The 2005 IEEE Congress on Evolutionary Computation, Sep. 2-5, 2005, pp. 537-542, vol. 1.

Cohen, J., "Statistical Power Analysis for the Behavioral Sciences," 1988, pp. 109-143, Second Edition, Lawrence Erlbaum Associates, Hillsdale, NJ.

European Partial Search Report, European Application No. 07111858.2, Feb. 6, 2008, 6 pages.

European Search Report for Application No. 07106515.5-1225, dated Apr. 21, 2008, 10 pages.

Hasenjager, M. et al., "Three Dimensional Aerodynamic Optimization for an Ultra-Low Aspect Ratio Transonic Turbine Stator Blade," Proceedings of the ASME Turbo Expo, ASME Paper No. GT2005-68680, 2005.

Hoile, C. et al., "Design by Morphogenesis," BT Technology Journal, Oct. 2000, pp. 112-121, vol. 18, No. 4.

Jin, Y., "A Comprehensive Survey of Fitness Approximation in Evolutionary Computation," Soft Computing, 2005, pp. 3-12, vol. 9, No. 1.

Manos, S. et al., "Photonic Device Design Using Multiobjective Evolutionary Algorithms," Evolutionary Multi-Criterion Optimization, 2005, pp. 636-650, vol. 3410/published by Springer Berlin / Heidelberg.

Menzel, S. et al., "Direct Manipulation of Free Form Deformation in Evolutionary Design Optimisation," Proceedings of the International Conference on Parallel Problem Solving from Nature (PPSN), 2006, pp. 352-361, Springer-Verlag.

Schwefel, H-P., "Evolution and Optimum Seeking," 1995, pp. 118-151, John Wiley & Sons, Inc.

Simpson, T.W. et al., "On the Use of Statistics in Design and the Implications for Deterministic Computer Experiments," Proceedings of the DETC '97, 1997 ASME Design Engineering Technical Conference, Sep. 14-17, 1997, Sacramento, CA, pp. 1-14.

Steiner, T. et al., "Towards Shape and Structure Optimization with Evolutionary Development," Proceedings of the $10^{th}$ International Conference on the Simulation and Synthesis of Living Systems, 2006, pp. 70-76.

Banzhaf, W. et al., "From Artificial Evolution to Computational Evolution: A Research Agenda," *Nature Reviews: Genetics*, Sep. 2006, pp. 729-735, vol. 7.

Kobayashi, K. et al., "A New Indirect Encoding Method with Variable Length Gene Code to Optimize Neural Network Structures," *IEEE*, 1999, pp. 4409-4412.

\* cited by examiner $$V = (v_1, v_2, v_3, \ldots)$$

$$N = (n_1, n_2, n_3, \ldots)$$

$$K = \{\{1,2,3\}, \ldots\}$$

AERODYNAMIC DESIGN OPTIMIZATION USING INFORMATION EXTRACTED FROM ANALYSIS OF UNSTRUCTURED SURFACE MESHES

FIELD OF INVENTION

The present invention is related to 3D aerodynamic design optimization where a huge amount of geometric data is often produced during the development of new improved designs that is translated into real-world aerodynamic hardware, more specifically, to 3D aerodynamic design optimization where the designs with most promising results in terms of one or more performance criteria are investigated further.

BACKGROUND OF THE INVENTION

If different optimization cycles of an iterative optimization algorithm are performed using different representations, it is difficult to find an adequate shape representation that captures the whole manifold of the generated designs and applicable to data mining techniques such as Self Organizing Maps (SOMs).

Each optimization cycle may be a manual or an automatic optimization process involving different design parameters. Using unstructured surface mesh as a general shape representation allows the analysis of local design modifications and their influence on performance values.

SUMMARY OF THE INVENTION

It is an object of the present invention to more efficiently optimize real-world structures including aerodynamic bodies such as turbine blades.

Embodiments disclosed relate to extracting information from designs that are not considered as the most promising during an optimization run or cycle. This information is used for guiding further optimization, thus, making optimization process more efficient.

Embodiments disclosed relate to a computer-implemented method for analyzing data representing the optimization of real-world designs expressed in physical entities according to at least one criterion. The embodiments attempt to find the areas of the design that are particularly sensitive to changes. Different modifications of the design are generated. Design data may be represented by unstructured triangular surface meshes. A displacement measure for corresponding points of modifications of two different cycles of the represented design data may be calculated. Performance difference between at least two design modifications may be calculated. The performance difference is expressed in terms of at least one criterion. Sensitivity information (for example, a signal) representing the interrelation between the displacement measure and the performance differences is output.

In one or more embodiments, a linear or non-linear interrelation may be represented by the sensitivity information.

In one or more embodiments, the sensitivity information is, for example, correlation coefficient or mutual information.

In one or more embodiments, the sensitivity information indicates which regions of the design affect the performance.

In one or more embodiments, correlations between design regions are calculated by rule induced from decision trees or other modelling techniques.

Embodiments disclose relate to a method for the optimization of data representing real-world designs such as aerodynamic bodies according to at least one criterion. Sensitivity information is generated preferably using a method as set forth above. The sensitivity information indicates how design changes at a defined area of the design affect the performance of the design. The performance is expressed in terms of at least one physical entity. Initial design parameters are set depending on the sensitivity information signal. A cyclic optimization algorithm such as an evolutionary optimization is executed starting from the initial design until a stop criterion is reached. Data representing an optimized real-world design is outputted.

In one or more embodiments, the position of spline control points is set depending on the sensitivity information and information about previously performed design modifications.

In one or more embodiments, strategy parameters such as global or individual step size are set depending on the sensitivity information signal and the rule set that captures information about the relation between distant design regions.

Embodiments disclosed further relate to a method for generating a meta model such as a neural network for computing the fitness of data representing real-world designs in terms of physical entities. The sensitivity information indicating how design changes at a defined area of the design affects the performance of the design is generated. The performance is expressed in at least one physical entity. The meta model is set up as unstructured surface meshes. The number of parameters for training the meta model using the sensitivity information is adapted.

Embodiments disclosed also relate to a computer program product implementing methods as set forth above when executed on a computing device.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE FIGURES

The teachings of the present invention can be readily understood by considering the following detailed description in conjunction with the accompanying drawings.

DETAILED DESCRIPTION OF THE INVENTION

Figure 1:
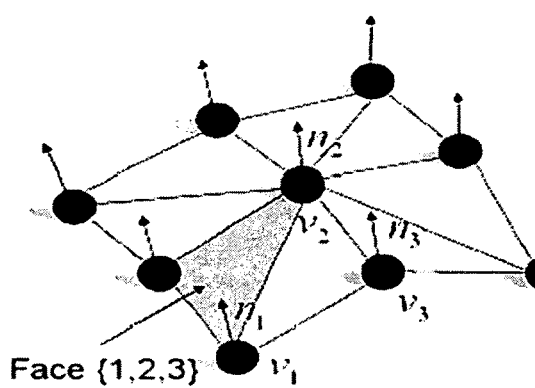
FIG. 1 is a diagram illustrating a triangulated surface mesh according to one embodiment.

Reference in the specification to "one embodiment" or to "an embodiment" means that a particular feature, structure, or characteristic described in connection with the embodiments is included in at least one embodiment of the invention. The appearances of the phrase "in one embodiment" in various places in the specification are not necessarily all referring to the same embodiment.

Some portions of the detailed description that follows are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps (instructions) leading to a desired result. The steps are those requiring physical manipulations of physical quantities. Usually, though not necessarily, these quantities take the form of electrical, magnetic or optical signals capable of being stored, transferred, combined, compared and otherwise manipulated. It is convenient at times, principally for reasons of common usage, to refer to these signals as bits, values, elements, symbols, characters, terms, numbers, or the like. Furthermore, it is also convenient at times, to refer to certain arrangements of steps requiring physical manipulations of physical quantities as modules or code devices, without loss of generality.

However, all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or "determining" or the like, refer to the action and processes of a computer system, or similar electronic computing device, that manipulates and transforms data represented as physical (electronic) quantities within the computer system memories or registers or other such information storage, transmission or display devices.

Certain aspects of the present invention include process steps and instructions described herein in the form of an algorithm. It should be noted that the process steps and instructions of the present invention could be embodied in software, firmware or hardware, and when embodied in software, could be downloaded to reside on and be operated from different platforms used by a variety of operating systems.

The present invention also relates to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The algorithms and displays presented herein are not inherently related to any particular computer or other apparatus. Various general-purpose systems may also be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the present invention as described herein, and any references below to specific languages are provided for disclosure of enablement and best mode of the present invention.

In addition, the language used in the specification has been principally selected for readability and instructional purposes, and may not have been selected to delineate or circumscribe the inventive subject matter. Accordingly, the disclosure of the present invention is intended to be illustrative, but not limiting, of the scope of the invention, which is set forth in the following claims.

Embodiments disclosed herein enhance the effectiveness of computer-implemented optimization of data representing real-word designs. The optimization is carried out in order to improve the performance of the design where the performance can be expressed in one or more physical measures.

Cyclic optimization methods produce at least one modification of the design per cycle. The design modifications can also stem from different runs or even from different optimization algorithms. Embodiments use displacement measure to measure local design modifications between surface meshes. The combination of the displacement measure with well known techniques from statistics and data mining allows the extraction of useful information from design database for supporting further optimizations. Information obtained indicates location-dependent performance sensitivity of the design to changes.

Embodiments may be used, among other applications, in the field of optimizing aerodynamic bodies. Embodiments provide basic techniques not for generating 3D designs but rather for measuring displacement and analyzing the correlation between displacement and specific performance criteria.

Surface Representation

In one or more embodiments, 3D unstructured triangular surface meshes are used as a general representation to describe the surface of each design for the optimization of the shape. Most shape representations can be converted to unstructured surface meshes. Mathematical framework for surface meshes is described, for example, in Marc Alexa, "Recent Advances in Mesh Morphing," Computer Graphics forum, vol. 21, no. 2, pp. 173-197 (2002), which is incorporated by reference herein in its entirety. It is assumed that the shape of a 3D design is described using a polygonal surface mesh M which is a partial linear approximation of the contour of the design. Each mesh M consists of a list of vertices V, a complex K and a list of normal vectors N. Vertex list $V=(\vec{v}_1, \ldots, \vec{v}_n)^T$ describes the geometric position of the vertices in $R^d$ where d=3 and $\vec{v}_i=(x_1, x_2, x_3)^T$.

A vertex can be seen as a sample point in the contour of the design. Each face of the polygonal surface mesh is defined by simplices of the form $\{i_1, i_2, i_3, \ldots, i_m\}$ where $i_j$, $l\epsilon[1 \ldots n]$ are indices pointing to vertices that enclose the polygonal face.

FIG. 1 is a diagram illustrating a triangulated surface mesh where the number of vertices m used to form one polygon is set to m=3. In addition to the vertex list, a list of normal vectors $N=(\vec{n}_1, \ldots, \vec{n}_n)$ is given. The normal vector provides information on the curvature of the surface at the position of vertex $\vec{v}_i$.

Displacement Measurement

In one or more embodiments, the task of tracking local design modifications between two surfaces includes measuring the displacement of one sample point on the surface of the first geometry to a point on the surface of the second geometry. In general, a sample point may be any point on the surface of the geometry.

Under the assumption that the surface triangulation results in surface meshes where the location and the number of vertices are sufficient to capture most characteristic changes of all designs at hand, the measurement of the displacement between corresponding sample points can be reduced to the measurement of the displacement between corresponding vertices. To measure the displacement between corresponding vertices, corresponding vertices need to be identified first and a proper metrics for measuring the amount and the direction of the displacement must be found.

Finding an appropriate algorithm for the identification of corresponding points is not considered herein. It is assumed that for each vertex on one design, a corresponding vertex or at least a good estimation of the corresponding vertex on the remaining designs exists.

Definition of the Displacement

Given two unstructured surface meshes and all corresponding vertices, local deformation is defined as displacement of one vertex of the first mesh to the location of the corresponding vertex of the second mesh. One way to capture the displacement is to use a difference vector $\vec{s}_{ij}=\vec{v}_j^m-\vec{v}_j^m$ which is the difference between vertex i of mesh l and vertex j of mesh m. An advantage of using the difference vector is that the vector clearly captures the correct displacement in the three dimensional space between both vertices.

There are some disadvantages that make the difference vector not useful for the analysis of local deformations between designs. One disadvantage is that the difference vector is sensitive to errors caused by estimation of corresponding points and to different sampling of the surface of the geometries. Another disadvantage is that using the difference vector needs d=3 parameters for describing the displacement of one vertex. In order to capture the displacement between two complete surface meshes, the number of parameters is 3·n where n equals the number of vertices. A higher number of parameters for describing the displacement makes following analysis and information extraction more difficult.

In order to eliminate the problems by using difference vector, the displacement measure according to equation (1) is employed to measure the amount and the direction of vertex modifications.

$$\delta_{i,j}^{l,m}=\delta(\vec{v}_i^l, \vec{v}_j^m)=(\vec{v}_i^l-\vec{v}_j^m)\bigcirc \vec{n}_i^l, \delta\epsilon(-\infty, +\infty) \quad (1)$$

The displacement measure is defined as the projection of the difference $$\vec{s}_{ij}=(\vec{v}_i^l-\vec{v}_j^m)$$

onto the normal vector $\vec{n}_i$ of vertex $\vec{v}_i$ of a given reference design l. The absolute value of the displacement measure provides information on the amount while the sign of the displacement measure in conjunction with the normal vector of the vertex provides information on the direction of vertex modification. The normal vector describes a tangential plane through the vertex points towards the normal or positive direction of vertex deformation.

Major Properties

By definition, the displacement measure describes the position of a vertex with reference to a previous position.

Figure 2A:
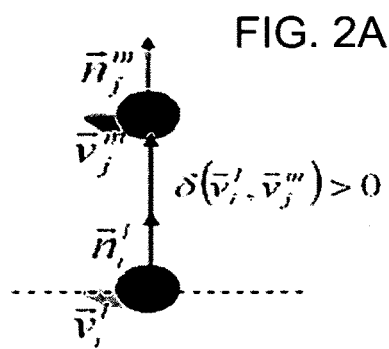
FIGS. 2A to 2D are diagrams illustrating cases of displacement measures, according to one embodiment.
Figure 2B:
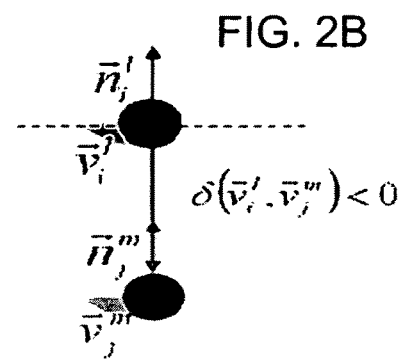
Figure 2C:
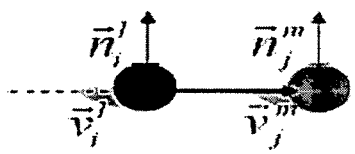
Figure 2D:
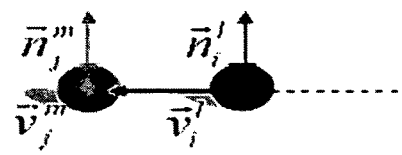

Furthermore, the displacement measure is a vector quantity containing both the magnitude and the direction of vertex modification. FIGS. 2A-2D illustrates some interesting characteristic properties of the displacement measure. Assume two corresponding $\vec{v}_i^l$ and $\vec{v}_j^m$, where $\vec{v}_i^l$ belongs to the mesh of the reference geometry l and $\vec{v}_j^m$ belongs to the deformed surface mesh m. If vertex $\vec{v}_i^l$ was moved into the positive direction of the normal vector and hence $\vec{v}_j^m$ is located above the tangential plane described by the normal vector, then the displacement value is positive (refer to FIG. 2A). If the deformed vertex $\vec{v}_j^m$ is below the plane described by the normal vector, the displacement value is always a negative, as illustrated in FIG. 2B. Finally, when $\vec{v}_j^m$ is located within the tangential plane of the normal vector, then the amount of the displacement measure equals zero (refer to FIGS. 2C and 2D). If $\vec{v}_i^l$ was deformed exactly along the normal vector, then the displacement measure equals the signed length of the difference vector $\vec{s}_{ij}=\vec{v}_i^l-\vec{v}_j^m$ which again equals the Euclidean distance between corresponding vertices.

Figure 3:
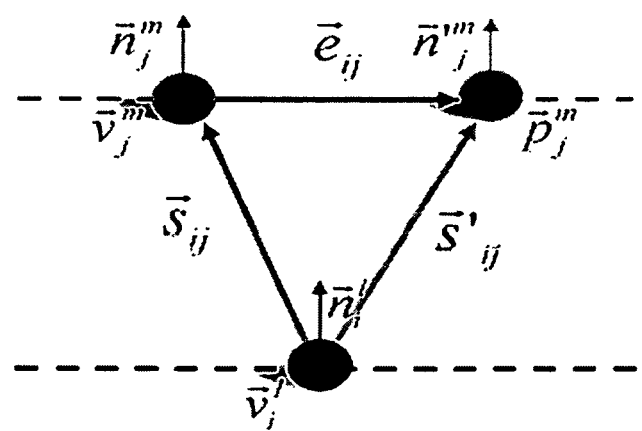
FIG. 3 is a diagram illustrating an error vector according to one embodiment.

Corresponding vertices may cause an error in the displacement measure as illustrated in FIG. 3 and written more formal in equations (2) and (3):

$$\delta_{i,j}^{l,m}=(\vec{s}_{ij}+\vec{e}_{ij})\bigcirc \vec{n}_i^l \quad (2)$$

$$\delta_{i,j}^{l,m}=\vec{s}_{ij}\bigcirc \vec{n}_i^l+\vec{e}_{ij}\bigcirc \vec{n}_i^l \quad (3)$$

where $\vec{e}_{ij}$ describes the error between the ideal displacement value and the measured displacement value. The difference vector between the correct matching corresponding point $p_j^m$ and vertex $\vec{v}_i^l$ is defined as $\vec{s}_{ij}$ while the difference vector between $\vec{v}_i^l$ and $\vec{v}_j^m$ is $\vec{s}_{ij}'$. The ideal difference vector can be written as $\vec{s}_{ij}' = \vec{s}_{ij} + \vec{e}_{ij}$, and hence, the displacement for the ideal difference vector is defined as in equation (3). Under the assumption that the curvature of both surfaces l and m is similar at the position of the corresponding vertices, it follows that $\vec{n}_i^l \approx \vec{n}_j^m$. Then the error term from equation (3) can be rewritten as shown in equation (4).

$$\vec{e}_{ij} \bigcirc \vec{n}_i^l \approx |\vec{e}_{ij}| \cos(\angle(\vec{e}_{ij}, \vec{n}_j^m)). \tag{4}$$

If an additional assumption of a smooth surface or a small error $|\vec{e}_{ij}|$ is made, $\vec{e}_{ij}$ is perpendicular to $\vec{n}_j^m$ and hence $\cos(\angle(\vec{e}_{ij}, \vec{n}_j^m)) \approx 0$. Therefore, the error term also becomes zero. From this, it is apparent that the displacement measure is less sensitive to small errors coming from surface triangulation or from the estimation of corresponding points.

Another advantage of using the displacement measure compared with the difference vector is that only n parameters are required for the description of the differences between two unstructured surface meshes.

Information Extraction from Design Data

In aerodynamic design optimization, the main goal is to find 3D shapes (implemented as real-world bodies) that are optimal for specific physical performance measures such as aerodynamic drag, lift or pressure loss with respect to constraints such as manufacturing limitations. The optimization of aerodynamic designs is often an iterative process where designs are generated, the performance of each design is determined, and a small number of outperforming designs are used as basis for further design modifications. Such design optimization process always produces a large amount of data and mostly just a small amount of information covered by the complete data set is used for developing new designs.

Embodiments use the displacement measure in conjunction with statistical and data mining methods in order to gain meaningful information from the design data set at hand. The information may be processed and outputted to guide the course of the optimization. The fact that the property of the displacement measure is a scalar value allows the calculation of statistical values such as mean, median, and correlation coefficient. Using the difference vector instead of the displacement measure complicates application of these formulas and methods. Further, using distance based measures such as the Euclidean distance may cause the information on the direction of the displacement to get lost.

Applying the Invention to the Optimization of 3D Turbine Blades

Figure 4:
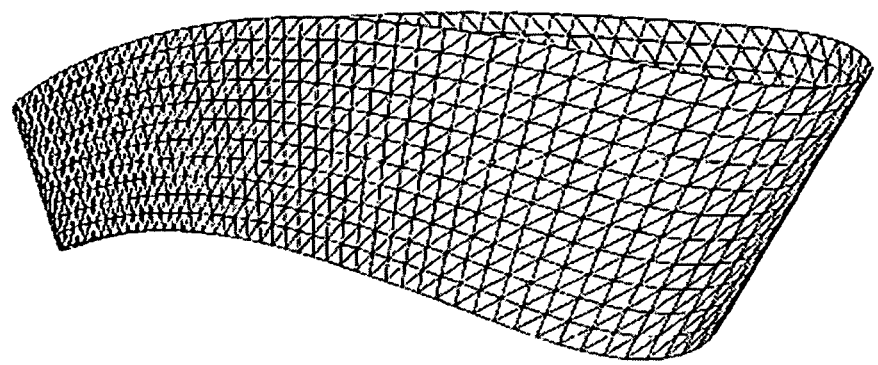
FIG. 4 is a diagram illustrating a triangular mesh defining the surface of a 3D turbine blade, according to one embodiment.

To demonstrate the applicability of the following methods to data from real world optimization problems, all methods are applied to turbine blade data set. The data set includes unstructured surface meshes shaping the surface of a three dimensional gas turbine stator blade. Each mesh consists of sample points equally distributed on the surface of the blade. The designs are chosen from a larger set of blade designs that are the result of several computational design optimization runs. For the optimization, the blade is represented by two B-spline surfaces which form the so-called hub and the tip section of the blade. Each section is defined by parameters that code the control points of the splines. The complete 3D blade design is then the result of a linear interpolation between both sections. Based on the spline representation, the unstructured surface mesh was generated by sampling the contour of the spline surfaces. Afterwards, quadrangular faces are generated by connecting corresponding sample points. Finally, the resulting faces are triangulated and refined as illustrated in FIG. 4. The triangulation was performed so that the normal vectors of the triangular faces and the normal vector of the vertices point towards the outside of the blade. No triangulation of the hub and tip section was performed because the flow is only simulated around the side-wall of the blade. For the simulation of the flow, an in-house Navier stokes flow solver HSTAR3D was used. Based on the simulated flow, the average pressure loss of the blade was calculated and the performance of the blade was determined. Turbine blade optimization is described, for example in Martina Hasenjager, Bernhard Sendhoff, Toyotaka Sonoda and Toshiyuki Arima, "Three dimensional aerodynamic optimization for an ultra-low aspect ratio transonic turbine stator blade," Proceedings of the ASME Turbo Expo, ASME Paper No. GT2005-68680, 2005, which is incorporated by reference herein in its entirety.

Displacement Analysis

Analyzing local modifications in the form of vertex displacement helps obtain some insights into the exploration of the design space. Two measures are suggested to analyze the local modifications: (1) the relative mean vertex displacement which provides information on how a vertex were modified based on one reference design, and (2) the overall displacement variance that highlights the vertices that were frequently modified.

(1) Relative Mean Vertex Displacement

In order to obtain information on local design modifications of the whole data set relating to one reference design, the relative mean vertex displacement (RMVD) is defined as in equation (5).

$$\vec{\delta}_i = \frac{1}{N-1} \sum_{m=1, m \neq r}^{N} \delta_{i,j}^{r,m} \tag{5}$$

Given a data set of N unstructured surface meshes, the RMVD calculates the mean displacement of vertex i of a predefined reference mesh r to each corresponding vertices j of the remaining meshes. Using the RMVD in conjunction with the suggested displacement measure, information on the mean amount and direction of modification of a vertex located at the surface of the reference design based on the whole design data set may be extracted. The displacement value averaging to a positive value indicates that the vertex was modified towards the normal vector of the vertex. A negative value indicates a modification against the normal direction of the vertex. If the RMVD value is zero, this means that the vertex was not modified or the performed modifications are equally weighted around the reference vertex.

If any outliers strongly affect the calculation of the RMVD, the use of a combination of the displacement measure with the statistical median is strongly recommended to retrieve the desired information.

FIG. 4 illustrates an example RMVD value calculated for the blade data set from a chosen reference design. The chosen reference design is one of the first initial blade designs before starting some optimization.

Figure 5:
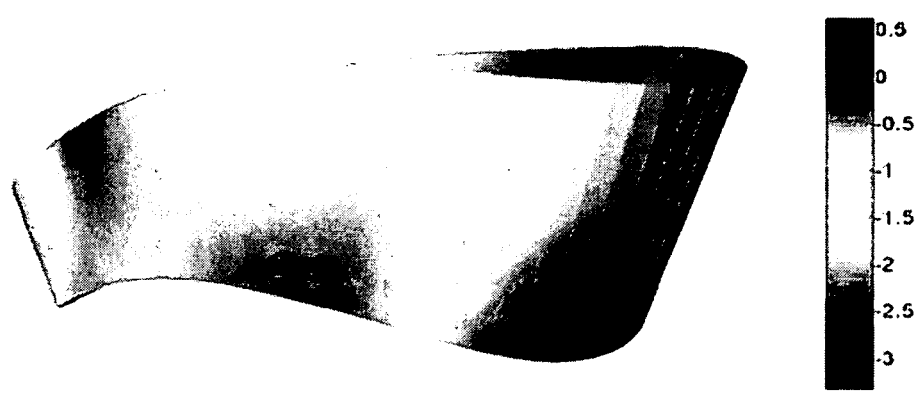
FIG. 5 is a diagram illustrating the mean value of a set of turbine blades, according to one embodiment.

The calculated RMVD values are encoded to corresponding grey code values and were mapped onto the surface mesh of the reference blade as illustrated in FIG. 5. Dark blue indicates modifications against the direction of the normal vector while dark red values identify modifications with the direction of the normal vector. Each normal vector of the vertices points to the outside of the blade. Calculating the RMVD provides a useful overview on the design modifications performed with respect to one reference design. In the presented example, it can be seen that the blade in general became thinner during the optimization process because one of the first blades was chosen as reference design.

(2) Overall Displacement Variance

To calculate the RMVD value, a reference design is needed. The mean displacements for all possible design combinations are calculated, as in following equation (6)

$$\overline{\delta}_i = \frac{1}{N(N-1)} \sum_{l=1}^{N} \sum_{m=1, m \neq l}^{N} \delta_{i,j}^{l,m} \approx 0 \qquad (6)$$

Assuming that the normal vectors of the corresponding vertices are similar, the mean displacement value will always be around zero. The reason is that if both normal vectors are similar, calculating the displacement of vertex i of design r to the corresponding vertex j of design m is approximately negative value of the displacement of vertex j to vertex i. Hence, the overall mean does not provide useful information on the design data set.

In order to obtain an overview on the variation of local design modifications, the overall displacement variance is defined as in equation (7).

$$\sigma_{\delta_i} = \sqrt{\sum_{l=1}^{N} \sum_{m=1, m \neq l}^{N} (\delta_{i,j}^{l,m} - \overline{\delta}_i)^2} \qquad (7)$$

This measure provides information on the strange and frequency of local design modifications based on the whole data set. The overall displacement variance can be reformulated as shown in following equation (8).

$$\sigma_{\delta_i} \approx \sqrt{2 \cdot \sum_{l=1}^{N} \sum_{m=l+1}^{N} (\delta_{i,j}^{l,m})^2} \qquad (8)$$

Equation (8) reduces computational costs especially in case where many vertices build up the surface mesh and the overall displacement variance measure needs to be calculated many times.

Sensitivity Analysis

In aerodynamic design optimization, one or more performance values are assigned to designs that describe some special characteristics of the flow surrounding the designs. The RMVD and the overall displacement variance capture only information about local design modifications and do not take the performance of designs into account. Extracting meaningful information about the correlation of design modifications and performance changes is helpful in developing new outperforming designs.

(1) Relative Vertex Correlation Coefficient

The relative vertex correlation coefficient (RVCC) is expressed as follows:

$$R_i^r = \frac{\sum_{m=1, m \neq r}^{N} (\delta_{i,j}^{r,m} - \vec{\delta}_i)(\phi^{r,m} - \overline{\phi}^r)}{\sigma_{\delta_i^r} \sigma_{\phi^r}} \qquad (9)$$

The RVCC in equation (9) calculates the linear correlation between the local modifications in the form of vertex displacement and the performance values, where $\phi^{r,m} = f^r - f^m$ is the performance difference between two designs r and m as shown in equations (10) and (11).

$$\sigma_{\delta_i^r} = \sqrt{\sum_{m=1, m \neq r}^{N} (\delta_{i,j}^{r,m} - \overline{\delta}_i^r)^2} \qquad (10)$$

$$\overline{\phi}^r = \frac{1}{N} \sum_{m=1, m \neq r}^{N} \phi^{r,m} \qquad (11)$$

The RVCC calculates the linear correlation based on a reference design r. Given the reference design, a positive RVCC value for vertex i indicates that moving the vertex towards the direction of the normal vector is likely to improve the performance of the design and vice versa. Two different situations may result in an RVCC value $R_i^r = 0$.

One situation is when modification of the vertex has no effect on the performance measure. The other situation is when the vertex is located in an optimal position (any modification will worsen or any modification will improve a performance value). In this case, the RVCC value will also be close to zero and indicate no relation between vertex displacement and performance.

In order to distinguish between both situations, a linear model may be fitted to the displacement- and performance difference-pairs and can calculate the residual to the fitted linear model. This residual provides information on the uncertainty of the correlation coefficient. The uncertainty of the correlation coefficient might also come from noisy data or non-linear relations between displacement measure and performance differences.

Figure 6:
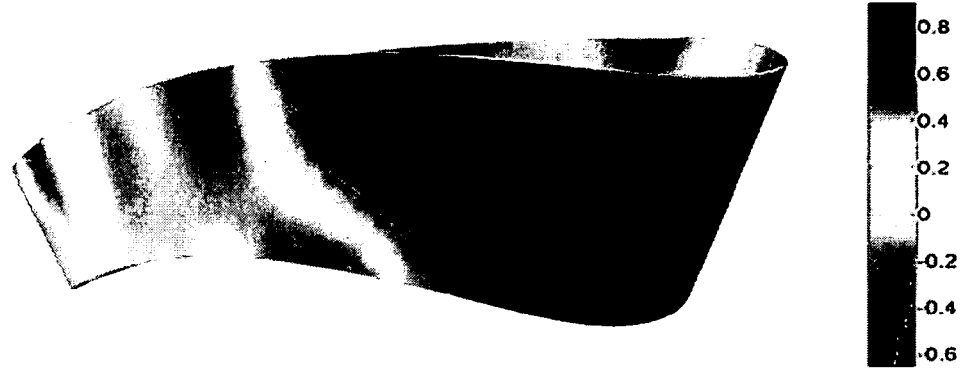
FIG. 6 is a diagram illustrating relative correlation value calculated for each vertex of a 3D turbine blade as mapped onto the surface of the blade, according to one embodiment.

The result can be seen in FIG. 6 where dark indicates negative RVCC values. This means that the displacement of dark vertices towards their normal vectors is most likely to worsen the performance measure. Conversely, red coloured vertices have positive RVCC values and hence a movement into the direction of the normal vector will probably improve the performance of the design. Without any direction information which is captured by the displacement measure, such conclusions can not be reached.

(2) Vertex Sensitivity

In order to identify vertices that are sensitive to performance changes based on the whole data set without referring to one reference design, the correlation coefficient is calculated based on all pair-wise design comparisons. Given N(N−1) displacement values for each vertex and N(N−1) performance differences, the overall vertex correlation coefficient is defined as expressed by equations (12) to (14).

$$R_i = \frac{\sum_{l=1}^{N} \sum_{m=1, m \neq l}^{N} (\delta_{i,j}^{l,m} - \overline{\delta}_i) \phi^{l,m}}{\sigma_{\delta_i} \sigma_{\phi}} \qquad (12)$$

$$\bar{\phi} = \frac{1}{N(N-1)} \sum_{l=1}^{N} \sum_{m=1, m \neq l}^{N} \phi^{l,m} = 0 \quad (13)$$

$$\sigma_\phi = \sqrt{\sum_{l=1}^{N} \sum_{m=1, m \neq l}^{N} (\phi^{l,m})^2} \quad (14)$$

The overall vertex correlation coefficient captures the linear relationship between the displacement and performance changes. Again, the Spearman rank correlation coefficient may be used instead of the Pearson correlation coefficient to become less sensitive to outliers and noise in the data.

In aerodynamic design optimization, the correlation between design modifications and performance changes is often highly non-linear. In order to capture such non-linearity, information based measures such as mutual information may be used to determine the sensitivity of vertices.

Applying a threshold or some statistical test to the calculated similarity measure such as mutual information, Spearman or Pearson correlation coefficient allows filtering of vertices that probably have no influence on the performance of the design. The filter process points out the most sensitive vertices and leads to a reduction in the number of parameters for describing the most important design modifications.

In a turbine blade example, the overall Pearson correlation coefficient is calculated to determine the sensitivity of each vertex. A threshold is applied to the correlation coefficient based on a fuzzy interpretation of the correlation coefficient disclosed, for example, in J. Cohen, "Statistical Power Analysis for the Behavioral Sciences," second edition, Hillsdale, N.J.: Lawrence Erlbaum Associates (1988), which is incorporated by reference herein in its entirety.

All vertices having the absolute value of the correlation coefficient below 0.3 were filtered out. The remaining vertices are identified as sensitive vertices which are either overall positively correlated or negatively correlated with the performance. See FIG. 7. Using mutual information instead of the Pearson or Spearman correlation coefficient, positive or negative correlations may not be determined.

C. Decision Tree and Rule Induction

When calculating the relative vertex correlation coefficient or performing sensitivity analysis, the displacement of each vertex is considered independent of the others. Correlations between vertices or design regions have not been considered yet. But in aerodynamics, the correlation between locally separated vertices or regions and its influence on the performance plays an important role. Facing this problem, the displacement of the vertices can be used as input for several techniques such as rule induction, Bayesian networks and decision trees. Such modelling techniques may capture the correlation between different inputs.

If the number of input parameters highly independent of the used technique, the extraction of meaningful and human readable rules becomes much more complicated. This is why sensitivity analysis as described above and the performing of further steps is advisable. One way to further reduce the number of parameters is to cluster vertices at the surface of the mesh to form sensitive regions. The displacement of the vertices closest to the cluster centers are then used to extract rules, generate decision trees or compute some other models. For the modelling process one can use real valued inputs that capture the sign and the amount of displacement as well as binary inputs that capture just the sign of the displacement measure. What kind of input must be chosen depends on the information one is interested in.

Figure 8:
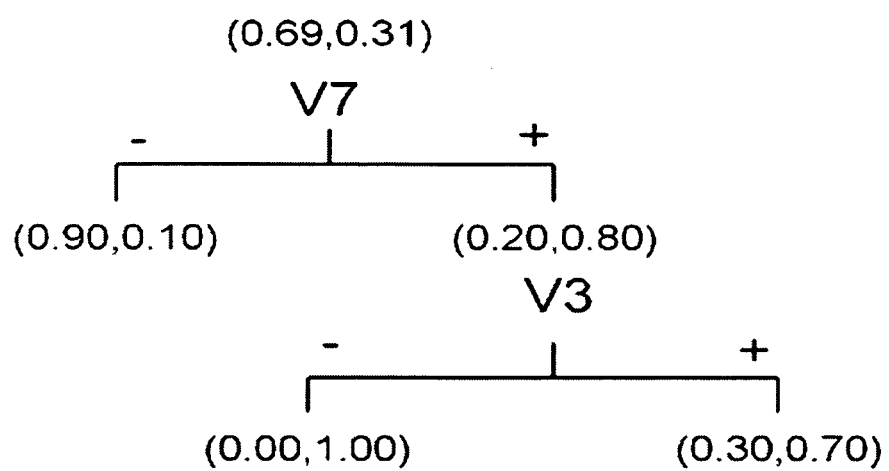
FIG. 8 illustrates a short version of a decision tree generated from the 3D turbine blade data set where only the sign of the displacement measure of a pre-selected set of vertices is used as input, according to one embodiment.

FIG. 8 illustrates a short version of a generated decision tree. After sensitivity analysis, a probabilistic based clustering is performed and the sign of the displacement measure of the vertices close to the cluster centers have been used as input for the demission tree. The tree shows the correlation between vertex V7, vertex V3 and their joint influence on the performance measure.

The short decision tree can be interpreted as follows. Without displacing any vertex, the probability of improving the performance is p=0.31 and for getting worse is p=0.69. But when moving vertex 7 (V7) in normal direction (+) and V3 against the normal direction results in a probability of p=1.00 for improving fitness based on the data set at hand.

Use of the Obtained Information as an Input Signal for the Aerodynamic Design Optimization Process This section describes how the information obtained from embodiments can be used to control the design optimization process.

A. Manual Design Optimization Process

In a manual aerodynamic design optimization process, the driving force and the source for innovation is the designer or aerodynamics itself. Nowadays, often advanced Computer-Aided Design (CAD) tools are used in aerodynamics to create and modify the shape of the design. Mostly it is up to the expert in the aerodynamics to create new outperforming designs. In ordinary wind tunnels, high fidelity simulations or others are used to determine the performance of the design, which is often highly time consuming. Providing the aerodynamics with meaningful information about the objective function helps reduce the number of performance evaluations and hence saves valuable time for further optimizations.

Most CAD applications may generate triangular surface meshes from the constructed designs, which allows CAD-data to be used for the analysis according to embodiments described herein. Most CAD applications may export surface meshes originates from the fact that unstructured triangular surface meshes in STL (stereo-lithography and later standard triangulation language) format are used for the rapid prototyping process. The mesh quality is therefore often tuned to rapid prototyping and does not fit well for data analysis, which then needs further post-processing steps.

Figure 9:
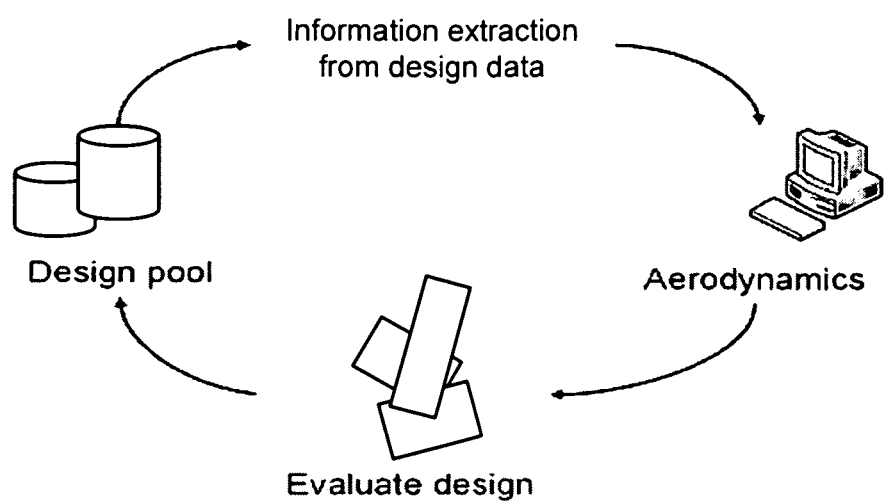
FIG. 9 is a diagram illustrating integration of the information extraction steps into a manual design optimization process, according to one embodiment.

FIG. 9 illustrates a circular process after integrating information extraction techniques into the manual optimization process, according to one embodiment. The design data pool includes all designs and the corresponding performance values that were designed and evaluated. One pivot design for calculating the corresponding points needs to be determined in advance before calculating the displacement values.

The exploration of modifications within the design data set helps the designer to focus on the investigation of design regions that were not changed so far. Applying sensitivity analysis to the design data set allows removal of local regions from optimization which to certain probability have no influence on the performance measure or add sensitive regions to the focus of optimization which seem to have strong influence on the performance. Furthermore, knowing the correlation between different design regions and their joint influence on the performance measure allows estimation of the quality of the design in advance. Adding these steps into the manual design optimization process may reduce evaluation time and speed up the optimization process.

B. Computational Design Optimization Process

Figure 10:
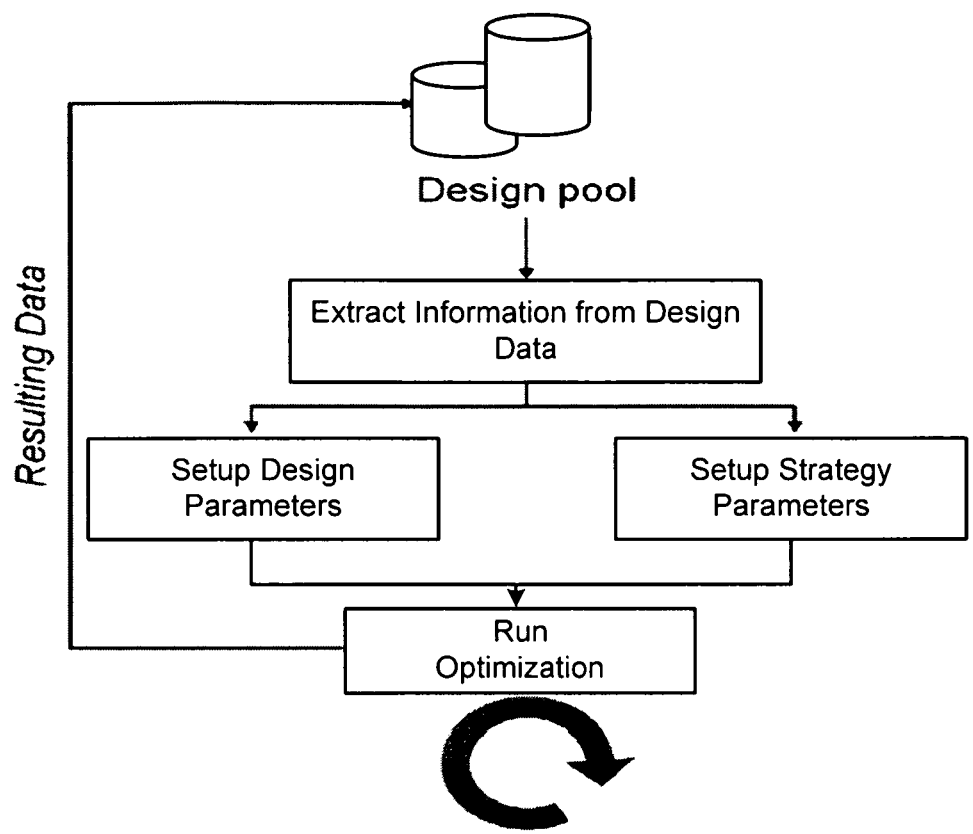
FIG. 10 is a diagram illustrating integration of information extracted from existing design data for setting initial design and strategy parameters, according to one embodiment.

In recent years, more and more computer-assisted optimization techniques are applied to aerodynamic design optimization. The list of different optimization algorithms is quite long, and includes gradient descent, linear programming, Newton's method, simulated annealing, evolution strategies and many more. All of these methods are common in that a set of objective parameters (e.g. spline control points, length, width or others) under control of the optimization technique and one or more performance values describing the performance of each solution (design) must be defined. In addition to the design parameters, almost all optimization techniques use a set of strategy parameters (e.g. step sizes) for guiding the optimization towards one or more optimal solutions. The strategy parameters are used for the generation of new solutions and may also be under the control of the optimization algorithm. Depending on the optimization technique used, the convergence of the algorithm is more or less sensitive to the initial setup of the design and/or strategy parameters. FIG. 10 is a diagram illustrating an overview of how to integrate information extracted from existing design data for specifying the initial setup of the design and strategy parameters, according to one embodiment.

Figure 7:
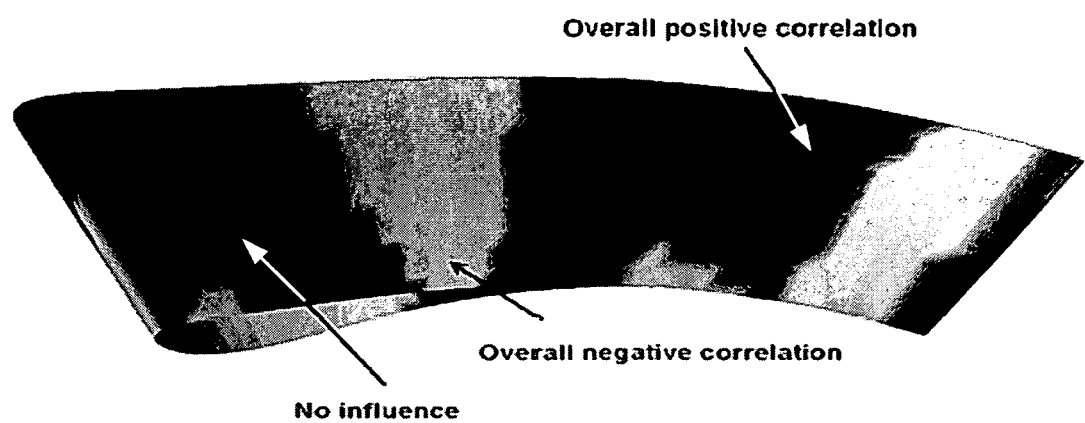
FIG. 7 is a diagram illustrating filtered points that probably does not affect the performance and vertices either having overall positive or negative correlation, according to one embodiment.

Given an existing data set from previous manual or computational optimization runs, the sensitivity analysis highlights design regions or vertices that are sensitive to the performance measure. With information about the sensitivities, the objective parameters can be set in a way so that the objective parameters have utmost influence on these regions or vertices. FIG. 7 illustrates the extracted sensitive regions of a blade design. In cases where spline based representations are used, the control points can be positioned directly close to the most sensitive points. In the blade example, the control points should be positioned close to the center of the clusters of the extracted sensitive regions. Then the control points have largest influence around sensitive vertices or regions are modified during the optimization. Using direct manipulation, the vertices from the unstructured surface mesh representation may be used directly as parameters for optimization, for example, as described in Stefan Menzel et al. "Direct Manipulation of Free Form Deformation in Evolutionary Design Optimisation," proceedings of the International Conference on Parallel Problem Solving From Nature (PPSN), Springer-Verlag, pp. 352-361 (2006), which is incorporated by reference herein in its entirety.

The efficient setup of the design parameters should also depend on the analysis of design modifications. The optimization parameters should also influence regions of the design that were not modified so far. For example, position control points around regions where the overall variance of the displacement measure is zero. This allows the exploration of new design concepts. Furthermore, this will add new information to the database.

One way to speed up the evolutionary project is to reduce the number of parameters that needs to be optimized. When rules indicating a close interrelation between sensitive regions or vertices can be extracted, these regions or vertices can be optimized together. This means that just one of two regions or vertices is optimized and the remaining one is modified with respect to the optimized one.

The above steps allow setting up of the most relevant parameters for the optimization. In general, the initial strategy parameters like step sizes are set in random. Setting up the strategy parameters with information from the database allows the optimization algorithm to select a preferred direction. In this way, the optimization algorithm reduces time for adapting the strategy parameters, and thus, starts to converge to an optimal solution earlier. To setup the strategy parameters, information from the sensitivity analysis may be used. Encoding of this information into the strategy parameters depends strongly on the choice of the objective parameters. Assume that the position (x,y,z) of a sensitive vertex is encoded and a start design is provided. The relative vertex correlation coefficient may be calculated with respect to the start design. The sign of the relative vertex correlation coefficient indicates the direction of modification that is more likely to improve the performance. If the strategy parameters encode step sizes for the coordinates of the sensitive vertices, the sign of the relative vertex correlation coefficient needs to be coded into the sign for the step sizes of x, y and z. The initial value for the step size may be set with respect to the amount of the relative vertex correlation coefficient.

After setting design and strategy parameters and starting the optimization algorithm, all generated results may be stored within the database for further analysis.

C. Surrogate Model

In computational design optimization, high fidelity simulations are often applied to evaluate the performance of a design. Simulates such as computational fluid dynamics (CFD) simulations that try to imitate real physical conditions are often highly time-consuming. Recently, approximation models such as polynomials, kriging model, feed-forward neural networks and others are used to partially substitute time consuming fitness evaluations. These models are also named surrogate models or meta models. The evaluation time is quite low compared to high-fidelity simulations. But the models can capture only a subset of the real performance landscape; and therefore, the surrogate models can not completely replace the original fitness evaluation. Surrogate models and substitution strategies are described, for example, in Yaochu Jin, "A Comprehensive Survey of Fitness Approximation in Evolutionary Computation," Soft Computing, vol. 9, no. 1, pp. 3-12 (2005), which is incorporated by reference herein in its entirety.

Figure 11:
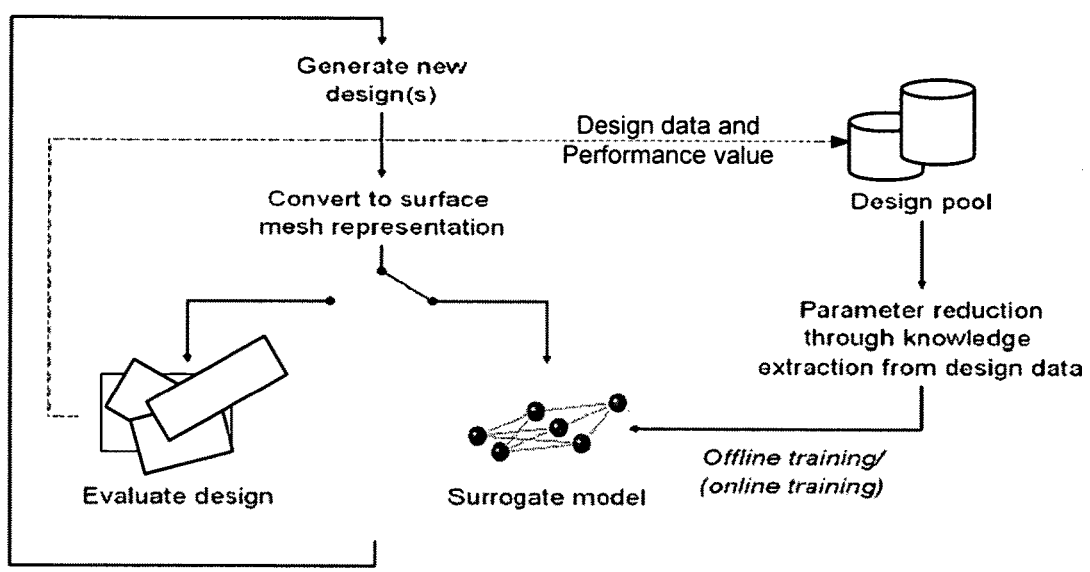
FIG. 11 is a diagram illustrating integration of a surrogate model into the optimization algorithm where unstructured surface meshes are used as a general representation for training the surrogate model and information extraction from design data is used to reduce the number of parameters for model training, according to one embodiment.
Figure 12:
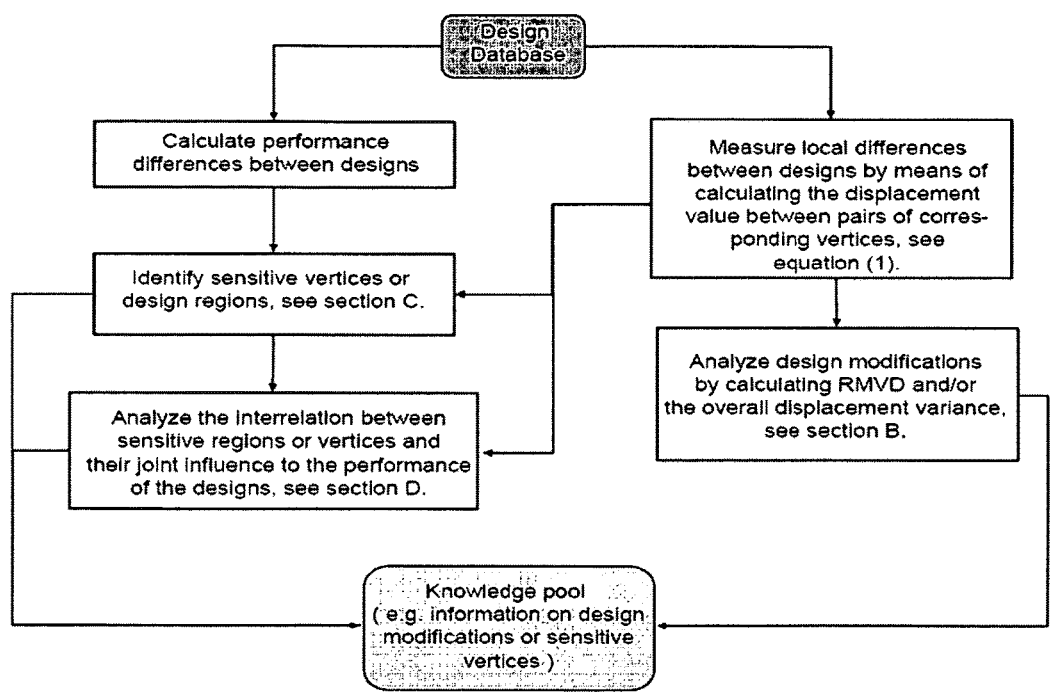
FIG. 12 is a flowchart illustrating the method of processing the information for optimization, according to one embodiment.

The estimation quality of the surrogate model depends strongly on the data that is used in training the model. Consistently using a general design representation like unstructured surface meshes allows as much design data as possible to be used for training without being restricted to the choice of the design parameters. Under the assumption that all designs can be converted to the surface mesh representation, all existing designs from previous optimization runs can be used for offline training of the model. Designs generated during the actual optimization run can be used to update the trained model or to train a new model and built up an ensemble of approximation models for the estimation of the performance of the designs. FIG. 11 is a diagram illustrating an overview on the complete process.

Because the number of parameters of a triangular surface mesh is much high in nearly all cases in order to train an approximation model in a reasonable way, the use of information extraction techniques is proposed to reduce the number of parameters before performing offline training of the model by following steps: (1) determine sensitivity of each vertex, (2) apply threshold for neglecting insensitive vertices, (3) cluster sensitive vertices to form sensitive regions, (4) determine cluster-centers of sensitive regions, (5) take displacement of cluster-centers with respect to a pivot design together with the performance values as training data for the approximation model, and (6) for the estimation of the performance of a new generated design during the optimization, apply the displacement of the cluster-centers on the pivot design to the corresponding cluster centers on the new design.

While particular embodiments and applications of the present invention have been illustrated and described herein, it is to be understood that the invention is not limited to the precise construction and components disclosed herein and that various modifications, changes, and variations may be made in the arrangement, operation, and details of the methods and apparatuses of the present invention without departing from the spirit and scope of the invention as it is defined in the appended claims.

What is claimed is:

1. A computer-implemented method for analyzing design data representing optimization of real-world design for physical entities according to at least one criterion, the method comprising:
    at a computing device, receiving a first design variation and a second design variation;
    at the computing device, representing the design data of the first design variation and the second design variation by unstructured triangular surface meshes, wherein an unstructured triangular surface mesh is defined as a discrete representation of a boundary of a three dimensional design;
    at the computing device, calculating a displacement measure between corresponding vertices of the first design variation and the second design variation representing local differences between the first and second design variations, wherein the displacement measure is defined as a projection of a difference vector between the corresponding vertices onto a surface unit normal vector at a location of a corresponding vertex of the first design variation, wherein vertices define the location of corresponding surface points of the first design variation and the second design variation in three dimensional Euclidean space;
    at the computing device, calculating a performance difference between the first and second design variations, the performance difference represented by at least one criterion;
    at the computing device, quantifying correlation between the displacement measure and the performance difference; and
    at the computing device, outputting sensitivity information representing the correlation between the displacement measure and the performance difference, wherein the sensitivity information indicates which vertices of the design influence the performance of the design.

2. The method of claim 1 wherein the sensitivity information represents a linear or non-linear correlation.

3. The method of claim 1 wherein the sensitivity information is a correlation coefficient or mutual information.

4. The method of claim 1 wherein correlation between regions of the design is calculated by rule induction from a decision tree.

5. The method of claim 1 wherein the first and second design variations belong to two subsequent cycles in a same optimization algorithm.

6. The method of claim 1 wherein the first and second design variations are produced by a first and second runs of a same design optimization algorithm or by different design optimization algorithms.

7. A non-transitory computer readable storage medium storing computer instructions, when executed, configured to cause a processor to:
    generate a first design variation and a second design variation;
    represent design data of the first design variation and the second design variation by unstructured triangular surface meshes, wherein an unstructured triangular surface mesh is defined as a discrete representation of a boundary of a three dimensional design;
    calculate a displacement measure between corresponding vertices of the first design variation and the second design variation representing local differences between the first and the second design variations, wherein the displacement measure is defined as a projection of a difference vector between the corresponding vertices onto a surface unit normal vector at a location of a corresponding vertex of the first design variation, wherein vertices define the location of corresponding surface points of the first design variation and the second design variation in three dimensional Euclidean space;
    calculate a performance difference between the first and second design variations the performance difference represented by at least one criterion;
    quantify correlation between the displacement measure and the performance difference; and
    output sensitivity information representing the correlation between the displacement measure and the performance difference, wherein the sensitivity information indicates which vertices of the design influence the performance of the design.

8. The computer readable storage medium of claim 7 wherein the sensitivity information represents a linear or non-linear correlation.

9. The computer readable storage medium of claim 7 wherein the sensitivity information is a correlation coefficient or mutual information.

10. The computer readable storage medium of claim 7 wherein correlation between regions of the design is calculated by rule induction from a decision tree.

11. The computer readable storage medium of claim 7 wherein the first and second design variations belong to two subsequent cycles in a same optimization algorithm.

12. The computer readable storage medium of claim 7 wherein the first and second design variations are generated by different runs of a same design optimization algorithm or by different design optimization algorithms.

13. The method of claim 1, wherein the sensitivity information further indicates regions of the design or vertices that are sensitive in respect to a performance measure.

* * * * *